(12) United States Patent
Hamilton

(10) Patent No.: US 11,284,525 B2
(45) Date of Patent: Mar. 22, 2022

(54) STORAGE ACCESSORY FOR MOBILE ELECTRONIC DEVICE

(71) Applicant: St. Croix Product Labs, Golden Valley, MN (US)

(72) Inventor: Patrick Hamilton, Golden Valley, MN (US)

(73) Assignee: ST. CROIX PRODUCT LABS, Golden Valley, MN (US)

( * ) Notice: Subject to any disclaimer, the term of this patent is extended or adjusted under 35 U.S.C. 154(b) by 0 days.

(21) Appl. No.: 16/906,169

(22) Filed: Jun. 19, 2020

(65) Prior Publication Data

US 2020/0404799 A1     Dec. 24, 2020

Related U.S. Application Data

(60) Provisional application No. 62/864,803, filed on Jun. 21, 2019.

(51) Int. Cl.
 *G06F 1/16* (2006.01)
 *H05K 5/02* (2006.01)
 *H05K 5/03* (2006.01)

(52) U.S. Cl.
 CPC ......... *H05K 5/0204* (2013.01); *G06F 1/1656* (2013.01); *H05K 5/0226* (2013.01); *H05K 5/03* (2013.01)

(58) Field of Classification Search
 CPC ................. G06F 1/1601; G06F 1/1626; A45F 2200/0516; A45F 2200/0525
 See application file for complete search history.

(56) References Cited

U.S. PATENT DOCUMENTS

| | | | | |
|---|---|---|---|---|
| 8,560,031 | B2 * | 10/2013 | Barnett | F16M 13/00 455/575.8 |
| 8,737,066 | B1 * | 5/2014 | Block | A45F 5/00 361/679.59 |
| 9,958,107 | B1 * | 5/2018 | Hobbs | H04M 1/04 |
| 10,200,518 | B2 * | 2/2019 | Richter | H04M 1/04 |
| 10,348,352 | B2 * | 7/2019 | Barnett | F16M 13/00 |
| 10,408,522 | B2 * | 9/2019 | Tsui | F25D 3/08 |
| 10,464,711 | B2 * | 11/2019 | Tsui | A47J 27/21008 |

(Continued)

FOREIGN PATENT DOCUMENTS

KR    20-2013-0006842 U    11/2013
KR         10-1891667       8/2018

OTHER PUBLICATIONS

International Search Report and Written Opinion issued for PCT/IB2020/055802, dated Sep. 28, 2020, 9 pages.

(Continued)

*Primary Examiner* — Anthony Q Edwards
(74) *Attorney, Agent, or Firm* — Hamre, Schumann, Mueller & Larson, P.C.

(57) ABSTRACT

A storage accessory that is attachable to a mobile electronic device that provides physical storage space to store items. The storage accessory can be attached to the mobile electronic device, attached to a protective case mounted on the mobile electronic device, or attached to another accessory, such as an extendable socket accessory or a ring holder/stand, that is attached to the mobile electronic device or to a protective case thereof. The storage accessory can be used to carry small items that a user desires to keep with them.

6 Claims, 28 Drawing Sheets

(56) References Cited

U.S. PATENT DOCUMENTS

| | | | |
|---|---|---|---|
| 10,655,775 B2* | 5/2020 | Hobbs | F16M 11/40 |
| 10,806,552 B1* | 10/2020 | Demoss | A61C 15/043 |
| 2012/0329534 A1* | 12/2012 | Barnett | G06F 1/1626 |
| | | | 455/575.8 |
| 2015/0077927 A1* | 3/2015 | Barnett | G06F 1/1688 |
| | | | 361/679.43 |
| 2016/0220000 A1 | 8/2016 | McGuckin | |
| 2017/0195000 A1 | 7/2017 | Srour | |
| 2018/0069585 A1 | 3/2018 | Azodi | |
| 2018/0288204 A1 | 10/2018 | Nahum et al. | |
| 2019/0089822 A1 | 3/2019 | Gartz et al. | |
| 2019/0138052 A1 | 5/2019 | Barnett et al. | |
| 2020/0253362 A1* | 8/2020 | Ruddy | A45F 5/00 |

OTHER PUBLICATIONS https://www.popsockets.com/; accessed Jun. 8, 2019.
https://www.popsockets.com/shop/popgrip/popgrip-stash?lang=en_US; accessed Jun. 18, 2020.

\* cited by examiner

STORAGE ACCESSORY FOR MOBILE ELECTRONIC DEVICE

FIELD

This technical disclosure relates to accessories for mobile electronic devices, particularly storage accessories that can be attached, directly or indirectly, to the mobile electronic device, and when attached provide physical storage space to store items.

BACKGROUND

U.S. Pat. Nos. 8,560,031 and 9,958,107 disclose extendable socket accessories, often referred to as PopSockets®, formed of accordion-like socket structures and having buttons attached at their distal ends, for attaching to mobile electronic devices or cases for mobile electronic devices. US 2019/0089822 discloses another version of an extendable socket accessory. When attached, the extendable socket accessories can be used to grip the mobile electronic device (and/or the case), used as a stand for the mobile electronic device (and/or the case), and used to manage cords associated with the electronic device.

U.S. Published Patent Application No. 2018/0288204 discloses a spinning accessory that can be attached to an extendable socket accessory. U.S. Published Patent Application No. 2018/0069585 discloses a case for a mobile electronic device that includes a cosmetic accessory attached to the case.

SUMMARY

A storage accessory is described that is attachable, directly or indirectly, to a mobile electronic device that provides physical storage space to store items in the storage accessory. The storage accessory can be attached directly to the mobile electronic device, attached to a protective case mounted on the mobile electronic device, or attached to another accessory, such as an extendable socket accessory, that is attached to the mobile electronic device or to a protective case thereof. The storage accessory can be used to carry small items that a user desires to keep with them. Examples of items that can be contained within the storage accessory include, but are not limited to, medicines such as pills, one or more hearing aid batteries, one or more safety pins, one or more baby wipes, and many other items.

Examples of mobile electronic devices that the storage accessory described herein can be used with include, but are not limited to, mobile phones, smartphones, tablet computers, electronic readers, digital media players, and other mobile electronic devices. Examples of mobile phones or smartphones include, but are not limited to, the types of devices sold under the tradenames such as iPhone®, Galaxy®, and the like. A mobile phone or smartphone includes similar devices that can access the internet and/or that can send/receive text messages regardless of whether or not the device can make a phone call.

In one embodiment, a mobile electronic device to which the storage accessory can be attached includes a front face or front surface with a display screen and user input elements that are incorporated into the display screen (i.e. in the form of touch input) or that are separate from the display screen. The mobile electronic device further includes a rear face or rear surface which is formed by the housing of the mobile electronic device itself or formed by a protective case disposed on the housing of the mobile electronic device.

The storage accessory is attached to the rear face/rear surface of the mobile electronic device (e.g. either to the rear of the housing of the mobile electronic device itself, or to the protective case) or attached to an extendable socket accessory that is attached to the rear face/rear surface of the mobile electronic device. The storage accessory has a low profile to make it as unobtrusive as possible while still providing storage capability.

DRAWINGS

DETAILED DESCRIPTION

Figure 1:
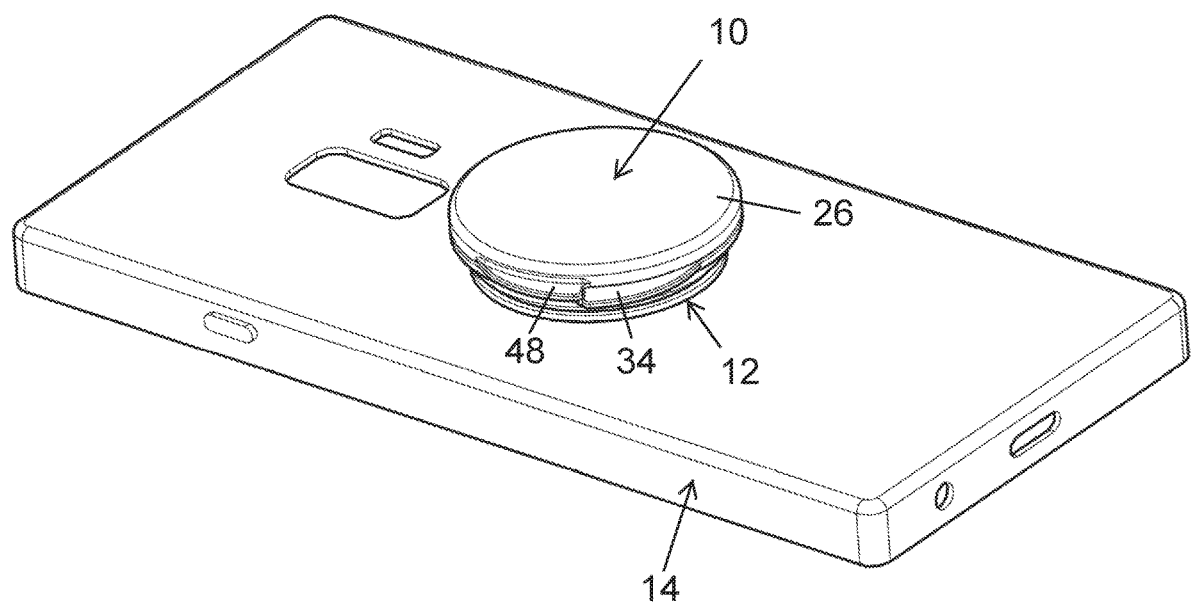
FIG. 1 is a perspective view of a storage accessory described herein attached to an extendable socket accessory disposed on a protective case forming the rear face/rear surface of a mobile electronic device, with the extendable socket accessory in a collapsed configuration.

A storage accessory is described in further detail below that is attachable, directly or indirectly, to a mobile electronic device that provides physical storage space to store items in the storage accessory. The storage accessory can be attached directly to the mobile electronic device (FIG. 5), attached to a protective case mounted on the mobile electronic device (FIG. 6), or attached to another accessory, such as an extendable socket accessory (FIGS. 1-4) or to a ring holder (FIGS. 10A-10B), that is attached to the mobile electronic device or to a protective case thereof.

In some embodiments, the storage accessory can be integrally formed with the accessory that is attached to the mobile electronic device or to the protective case so as to form a one-piece construction with the accessory. Accordingly, unless indicated to the contrary, the term attached is intended to encompass a storage accessory that is initially separate from but then mechanically secured to the accessory, as well as encompass a storage accessory that is integrally formed with the accessory to form a one-piece construction with the accessory.

The storage accessory can be used to carry small items that a user desires to keep with them along with the mobile electronic device. Examples of items that can be contained with the storage accessory include, but are not limited to, medicines such as pills, one or more hearing aid batteries, one or more safety pins, one or more baby wipes, and many other items.

For example, many people have prescriptions for nitroglycerin who seldom or never use the medication, yet they need to have it with them in case of the onset of angina. Due to the lack of any regular need, it is easy for these individuals to lose track of where their medication is. However, people tend know where their mobile electronic devices such as mobile phones and smartphones are at all times. Accordingly, a container which is an integral part of the mobile phone, smartphone, or a protective case thereof, or which integrates with a phone accessory such as an extendable socket accessory, would allow the individuals to keep their medication near.

Examples of mobile electronic devices that the storage accessory described herein can be used with include, but are not limited to, mobile phones, smartphones, tablet computers, electronic readers, digital media players, and other mobile electronic devices. Examples of mobile phones or smartphones include, but are not limited to, the types of devices sold under the tradenames such as iPhone®, Galaxy®, and the like. A mobile phone or smartphone includes similar devices that can access the internet and/or that can send/receive text messages regardless of whether or not the device can make a phone call.

In one embodiment, the storage accessory can be removable or repositionable on the mobile electronic device. In other embodiments, the storage accessory can be intended to be permanently attached to the mobile electronic device or to a protective case for the mobile electronic device so that the storage accessory can only be removed by destroying some or all of the storage accessory. In yet another embodiment, the storage accessory can be an integral part of the mobile electronic device or its protective cover, molded or fabricated directly into the mobile electronic device or its protective cover.

The storage accessory can be of any size or shape appropriate to the mobile electronic device.

The storage accessory can include a removable cover providing access to the interior storage space where the removable cover can be, for example, snap shut, screwed on, secured using an interference fit, or twisted on and off using threads or via a bayonet-type connection. In some embodiments, the storage accessory may open from the side rather than from the top.

The storage accessory can be fabricated of many appropriate materials or combinations of materials. Appropriate materials include, but are not limited to, plastic, aluminum, steel, glass, ceramic, and wood. In one embodiment, the storage accessory including the cover, can be formed from plastic. In some embodiments, the storage accessory can be made of FDA compliant material such as medical grade polypropylene safe for medication storage.

In some embodiments, the storage accessory can have an integral "living hinge" between the removable cover and a base of the storage accessory. In some instances, the cover may be attached to the base using a lanyard-like device. The storage accessory may have a "child proof" feature incorporated into the cover as well to inhibit children from opening the cover.

In some embodiments, an application on the mobile electronic device may be associated with the storage accessory. For example, the application may remind the user to take medication or the user may use the application to record the time and date and other information regarding the use of the contents of the storage accessory.

Example implementations of a storage accessory 10 will be described below with respect to FIGS. 1-9. For sake of convenience in describing the concepts, the storage accessory 10 will be described as being mounted, directly or indirectly, on a mobile electronic device in the form of a mobile phone or smartphone. Hereinafter, the term "mobile phone" will be used and is intended to encompass smartphones and like devices. However, the storage accessary 10 can be used with other forms of mobile electronic devices.

FIGS. 1-4 illustrate one example implementation of the storage accessory 10 described herein. In this example, the storage accessory 10 is mounted to an extendable socket accessory 12 that is disposed on a protective case 14 of a mobile phone 16 (visible in FIGS. 5 and 6). As would be understood, the protective case 14 surrounds and covers at least the side edges and much of the rear surface of the mobile phone 16. So in essence, when the protective case 14 is in position on the mobile phone 16, the protective case 14 forms the rear face/rear surface of the mobile phone 16.

Figure 2:
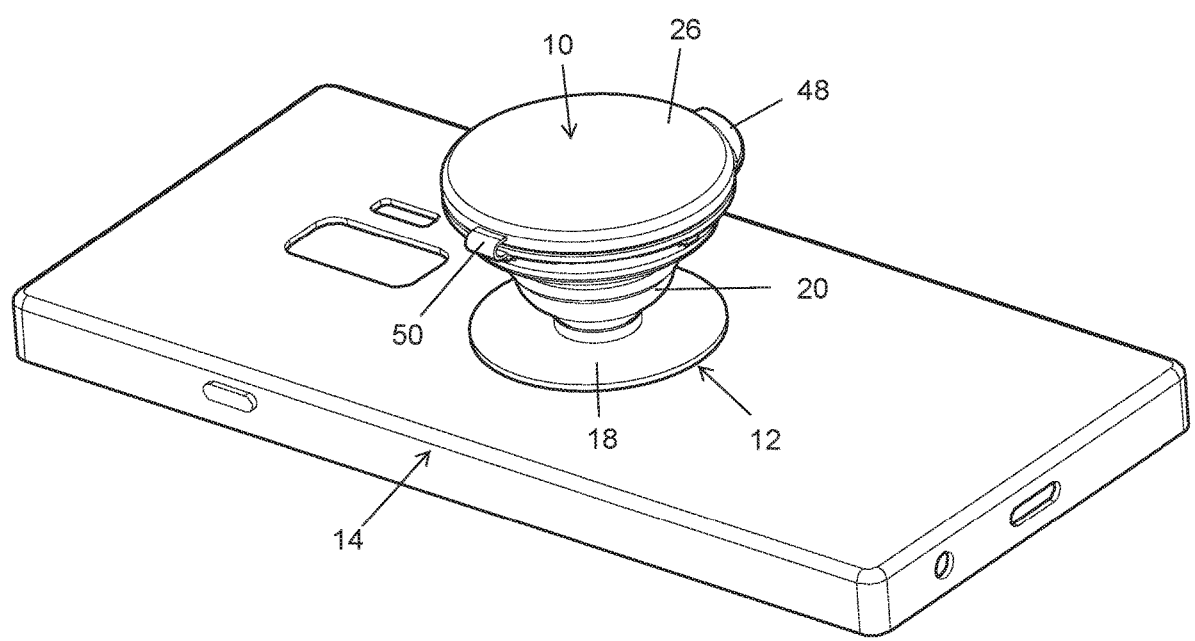
FIG. 2 is a perspective view similar to FIG. 1 but with the extendable socket accessory in an extended configuration.
Figure 3:
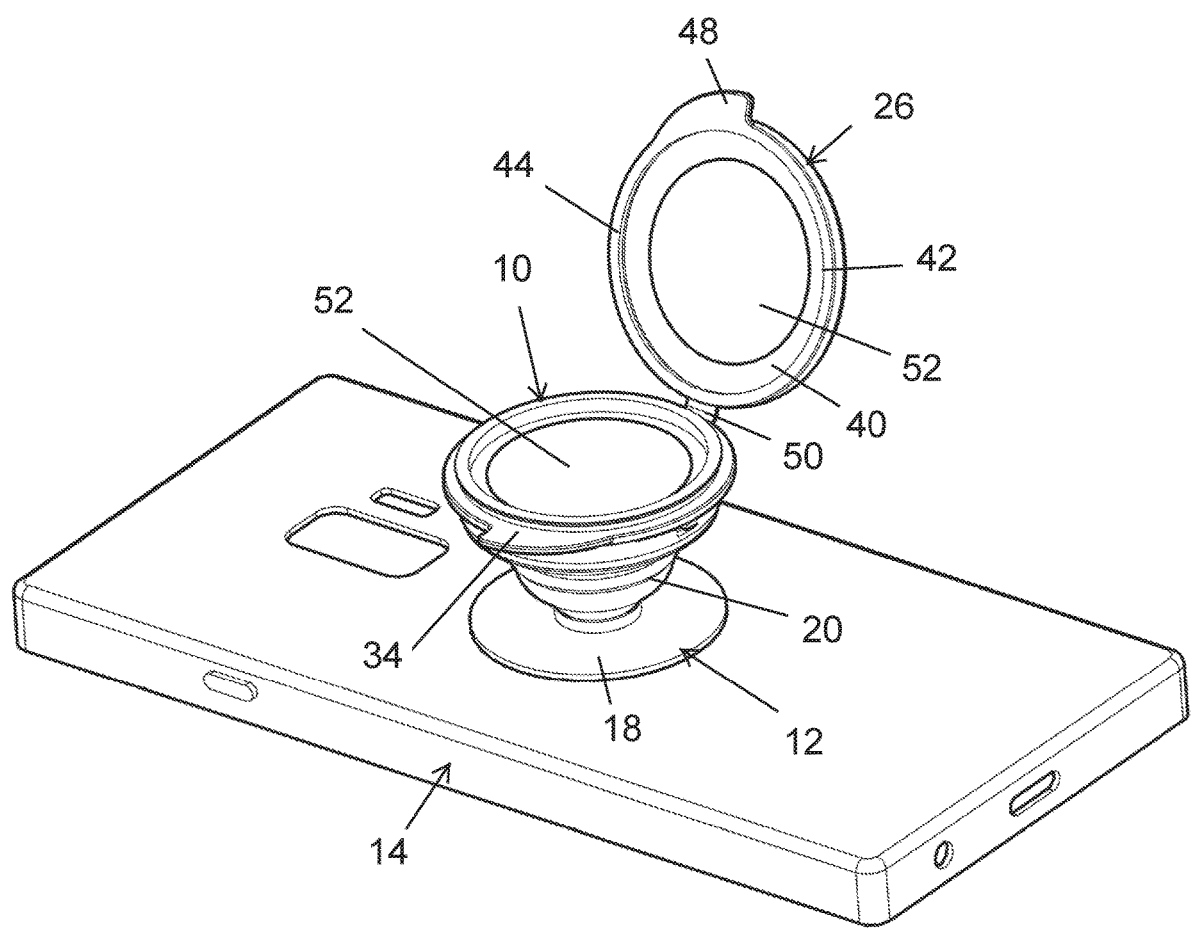
FIG. 3 is a perspective view similar to FIG. 2 but with the storage accessory opened.
Figure 4:
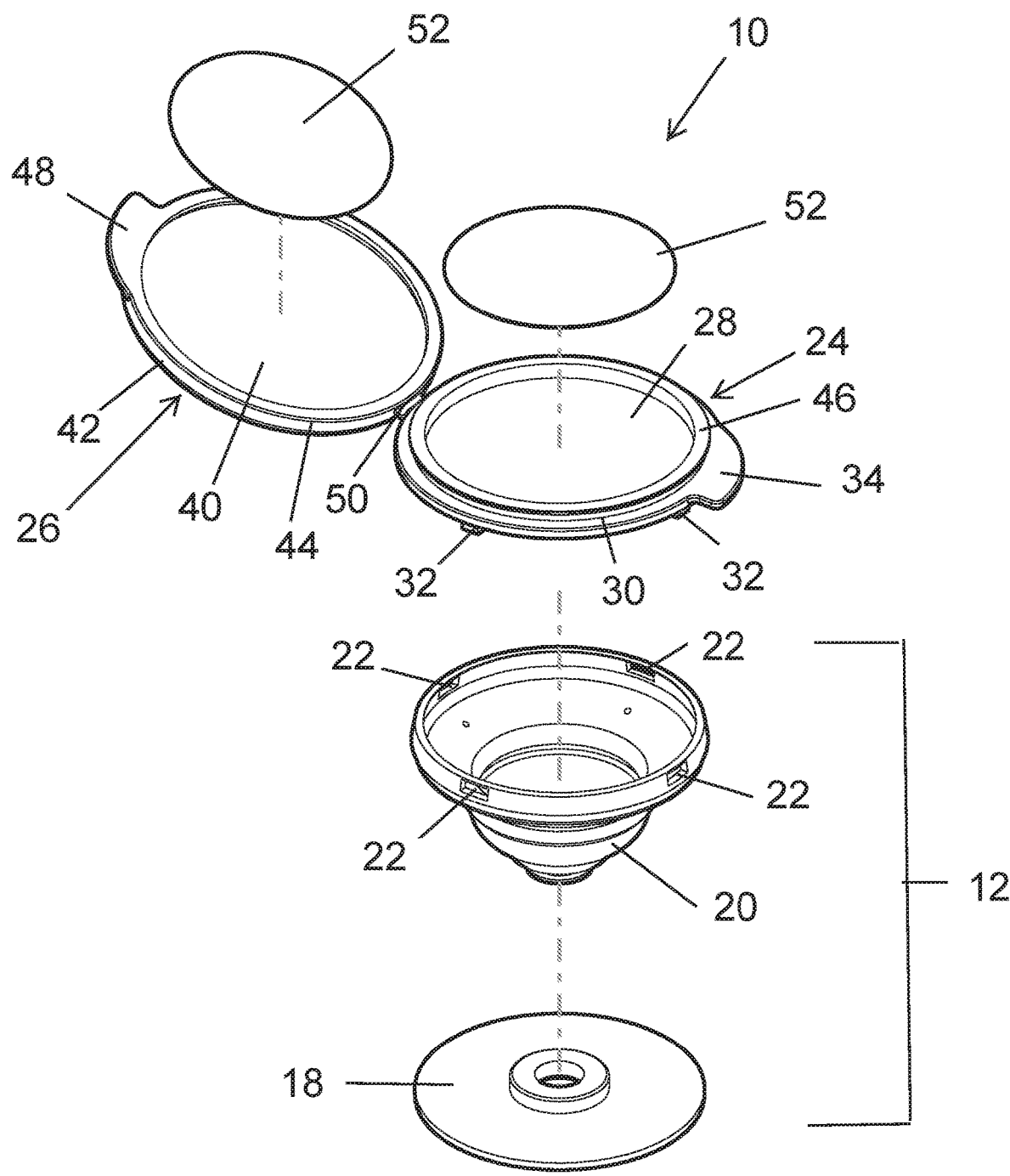
FIG. 4 is an exploded view of the storage accessory and the extendable socket accessory.
Figure 5:
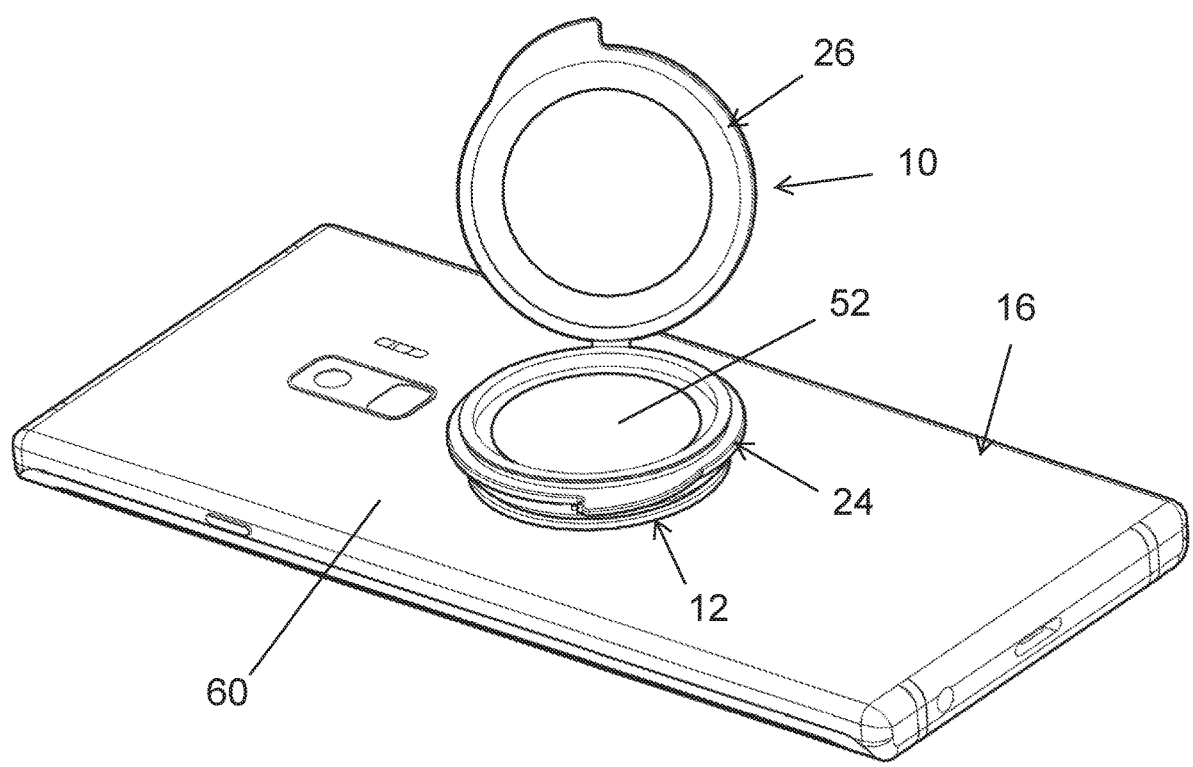
FIG. 5 is a perspective view of the storage accessory described herein attached to the housing of the mobile electronic device.

The extendable socket accessory 12 is of conventional construction and is fixed to the protective case 14. As best seen in FIGS. 2-4, the extendable socket accessory 12 includes a platform 18 for mounting the extendable socket accessory 12 to the surface of the protective case 14, and a collapsible and extendable accordion portion 20 secured to and extending from the platform 18. Further details on the construction and operation of the extendable socket accessory 12 can be found in U.S. Pat. Nos. 8,560,031 and 9,958,107, as well as U.S. Published Application No. 2018/0288204, each of which is incorporated herein by reference in its entirety. The extendable socket accessory 12 can also have a construction as disclosed in U.S. 2019/0089822 which is incorporated herein by reference in its entirety.

The storage accessory 10 is attached to the extendable accordion portion 20 in any suitable manner to allow the storage accessory to move with the extendable accordion portion 20. For example, a button (not shown) is typically removably attached to the extendable accordion portion 20 to close the end of the extendable accordion portion 20. For example, the button may include tabs that extend therefrom and that engage in openings 22 (best seen in FIG. 4) formed in the extendable accordion portion 20.

However, in this embodiment the button can be removed, and in its place the storage accessory 10 can be mounted. In particular, with reference to FIGS. 3-4, the storage accessory 10 can include a base 24 and a cover 26 that can be moved from a covering position over the base to define a storage space between the base 24 and the cover 26 (FIGS. 1-2), and an uncovered position allowing access to contents within the storage space (FIGS. 3-4).

Figure 7:
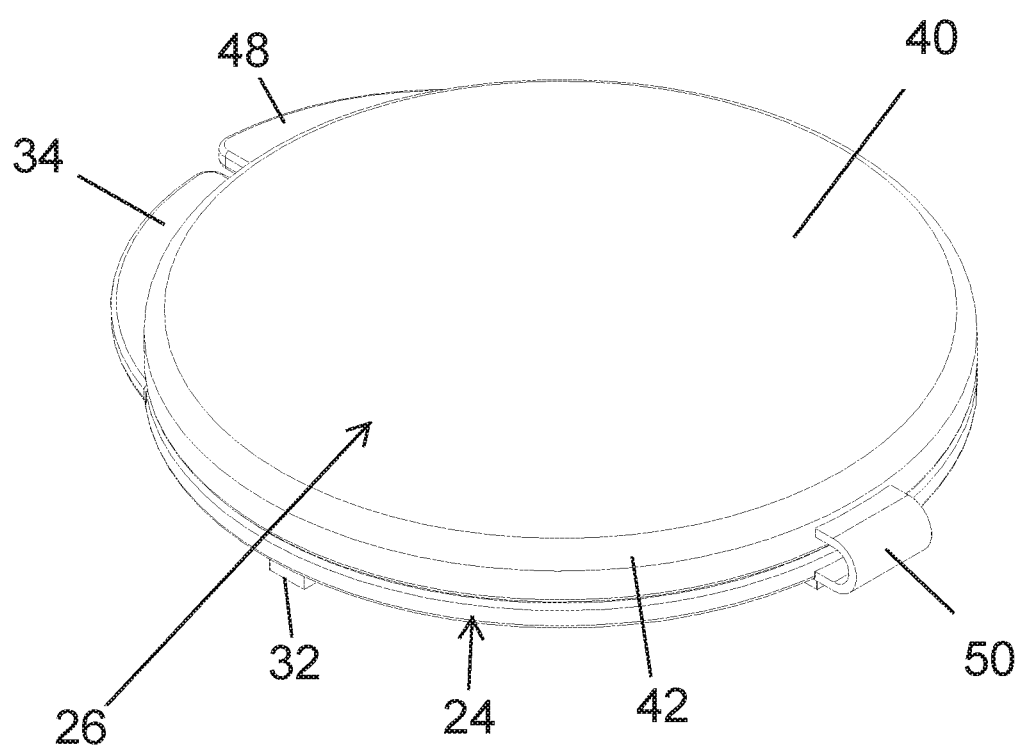
FIG. 7 is a perspective view of the storage accessory described herein with the storage accessory closed.
Figure 8:
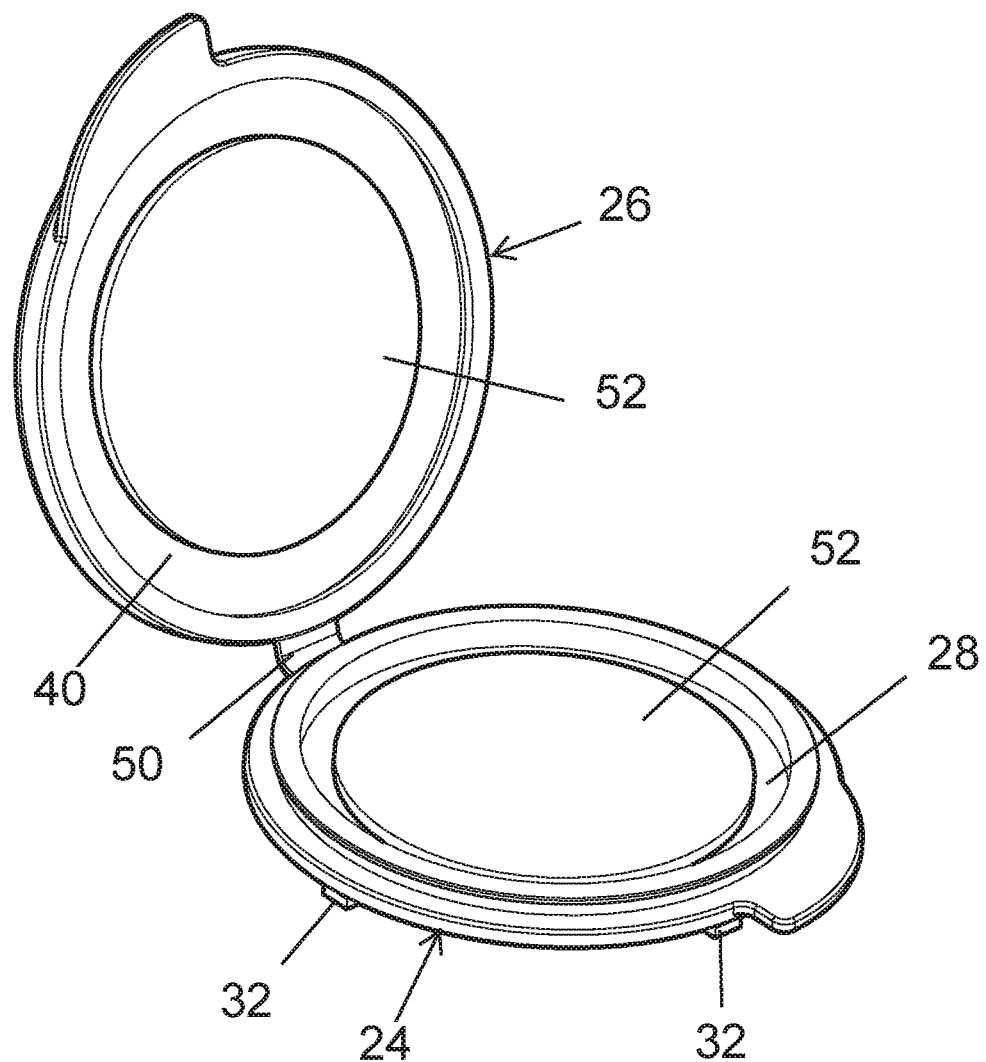
FIG. 8 is a perspective view of the storage accessory described herein with the storage accessory opened.
Figure 9A:
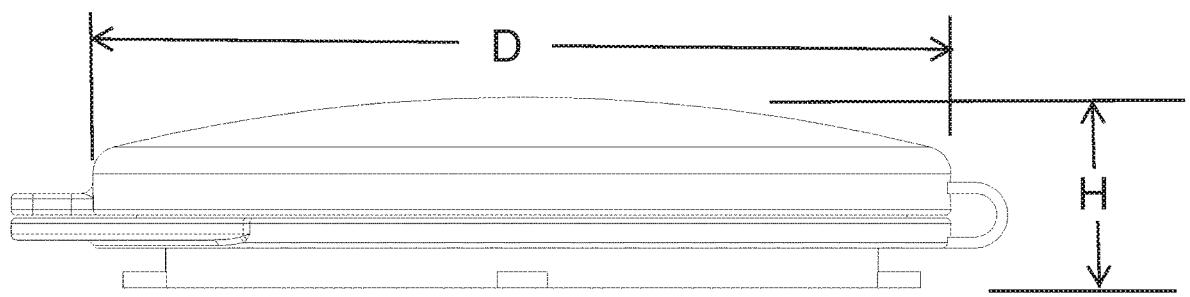
FIGS. 9A and 9B are side views of the storage accessory described herein, with the storage accessory in FIG. 9A configured to attach to an extendable socket accessory, and the storage accessory in FIG. 9B configured to mount directly to the mobile electronic device or to the protective case thereof.
Figure 9B:
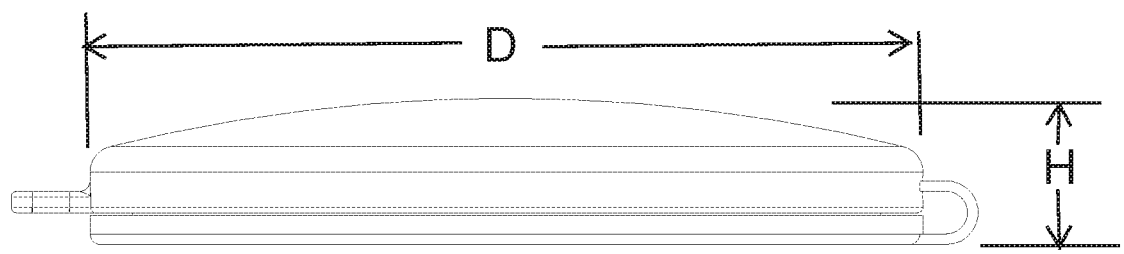

As best seen in FIGS. 4 and 7-8, the base 24 includes a bottom wall 28 and a side wall 30 that extends upward from the bottom wall 28 to define a lower portion of the storage space. Tabs 32 extend from the base 24 at locations corresponding to the openings 22 so that the tabs 32 can fit into the openings 22 to releasably secure the base 24 to the extendable accordion portion 20. In the illustrated embodiment, the base 24 is generally circular in shape to correspond to the generally circular shape of the top of the extendable accordion portion 20. However, the base 24 can have other shapes such as rectangular, square, triangular, hexagonal, or the like. In addition, a finger tab 34 projects radially from the base 24 which is used to aid in actuating the cover 26 to the uncovered position as described further below.

With continued reference to FIGS. 4 and 7-8, the cover 26 includes a top wall 40 and a side wall 42 that extends downward from the top wall 40 to define an upper portion of the storage space. The side wall 42 and the side wall 30 are configured to releasably engage with one another to releasably retain the cover 26 at the covering position and permit manual release of the cover 26 from the base 24 to open the storage accessory 10. Any mechanism can be used to releasably engage the side walls 30, 42. For example, in the illustrated example, the side wall 42 can include a retaining lip 44 and the side wall 30 can include a flange 46, where the lip 44 and the flange 46 form a releasable snap-fit mechanism. In the illustrated embodiment, the cover 26 is generally circular in shape to correspond to the generally circular shape of the base 24. However, the cover 26 can have other shapes such as rectangular, square, triangular, hexagonal, or the like. In addition, a finger tab 48 projects radially from the cover 26 which is used to aid in actuating the cover 26 to the uncovered position as described further below.

In some embodiments, the cover 26 can remain attached to the base 24 when the cover 26 is at the uncovered position. For example, referring to FIGS. 2-4 and 7-8, the storage accessory 10 can have an integral living hinge 50 between the cover 26 and the base 24. Alternatively, the cover 26 may be attached to the base 24 using a lanyard-like device. In other embodiments, no mechanism connects the cover 26 to the base 24 when the cover 26 is at the uncovered position.

The storage accessory 10 is configured to be of low profile yet provide some storage space therein for small items. For example, with reference to FIGS. 9A-B, the storage accessory 10 can have a total height H of between about 0.25 inches to about 0.6 inches. For example, in one embodiment, the height H can be about 0.348 inches. In another embodiment, the height H can be about 0.28 inches. The storage accessory can have a diameter D of between about 0.75 inches to about 2.75 inches. In one embodiment, the diameter D can be about 1.565 inches. In the embodiment in FIG. 9B, only a single finger tab is present, for example on the lid for lifting the lid since the base is securely affixed to the mobile phone making a finger tab on the base unnecessary.

In operation of the storage accessory 10, with the cover 26 in the uncovered position, an item(s) to be stored is placed in the space defined by the base 24. The cover 26 is then manually actuated toward the base 24, and the cover 26 is snap connected to the base 24 to retain the cover 26 at the covering position to retain the item(s) in the storage accessory 10. To open the storage accessory 10, the user places one finger on the top side of the finger tab 34 and another finger on the bottom side of the finger tab 48 and pushes them apart. This forces the cover 26 away from the base 24 thereby separating the cover 26 from the base 24 to the uncovered position and thereby opening the storage accessory 10.

Referring to FIG. 8, when the storage accessory 10 is used to store medicinal pills, such as nitroglycerin pills, it may be useful to secure the pills in position within the storage accessory to prevent the pills from moving within the storage space and bumping into other pills within the space which can degrade the pills. In such an embodiment, a liner 52 can be provided in the storage accessory 10 which serves to retain the positions of the pills when the cover 26 is in the covering position on the base 24. The liner 52 can be any soft material that can safely come into contact with the pills when the cover 26 is closed to retain the pills in position without destroying the pills. Examples of liners that can be used include, but are not limited to, a textile, fabric, foam, cloth, gel and combinations thereof. The liner 52 can be made of cotton, felt, or other materials. The liner 52 can be provided on the interior of the base 24 (for example on the bottom wall 28), on the interior of the cover 26 (for example on the top wall 40), or on both the base 24 and the cover 26. In some embodiments, the liner 52 of the base 24 may be non-destructively removable from the base 24 whereby the liner 52 can be removed from the base 24 without destroying the liner 52 or the base 24.

The storage accessory 10 is not limited to being mounted on the extendable socket accessory 12 or on the protective case 14. For example, with reference to FIG. 5, the storage accessory 10 is illustrated as being mounted on the extendable socket accessory 12 in the manner discussed above for FIGS. 1-4, with the socket accessory 12 being mounted directly on a housing 60 of the mobile phone 16 on the rear of the mobile phone 16. Alternatively, the storage accessory 10, in particular the base 24 thereof, can be mounted directly to the housing 60 of the mobile phone 16 without using the socket accessory 12. The storage accessory 10 can be attached to the housing 60 of the mobile phone 16 using any suitable attachment means including, but not limited to, an adhesive, hook and loop fastener, a suction cup, a mechanical attachment such as a bayonet fitting, or other attachment means.

Figure 6:
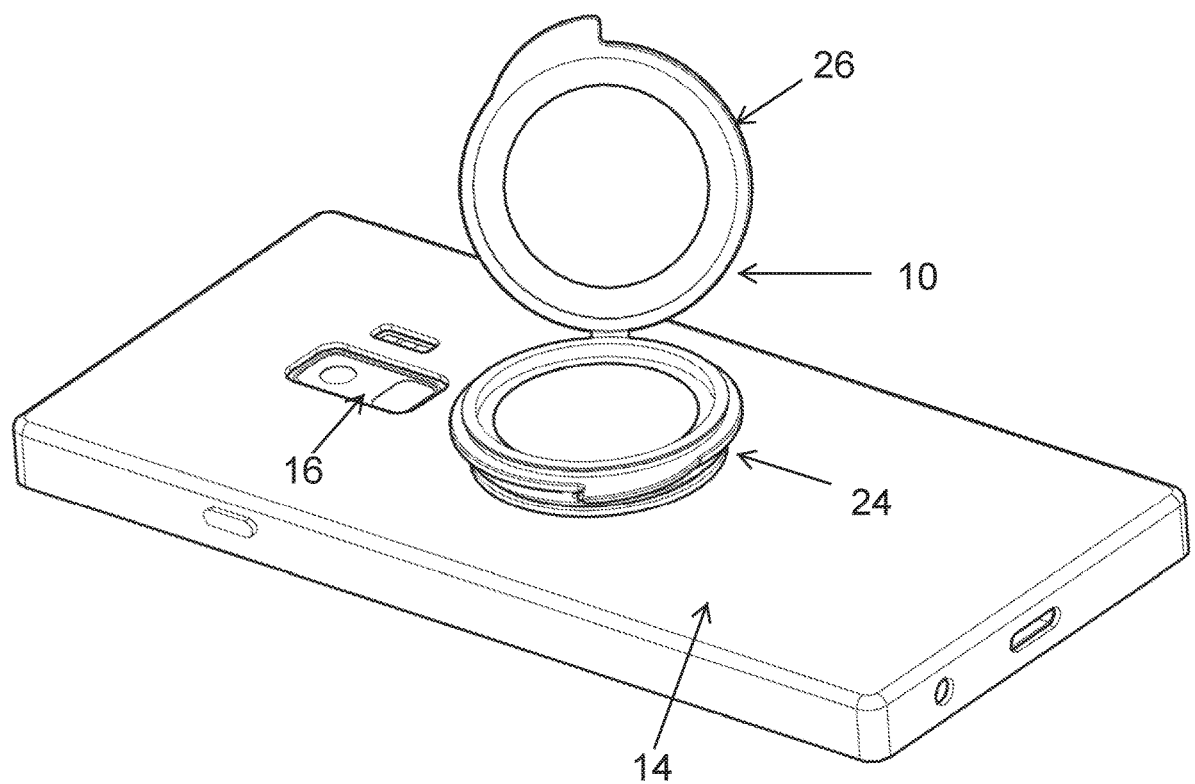
FIG. 6 is a perspective view of the storage accessory described herein attached to the protective case.

FIG. 6 illustrates the storage accessory 10 described herein attached directly to the protective case 14 without using the socket accessory. The storage accessory 10 can be attached to the protective case 14 using any suitable attachment means including, but not limited to, an adhesive, hook and loop fastener, a suction cup, a mechanical attachment such as a bayonet fitting, or other attachment means.

Figure 10A:
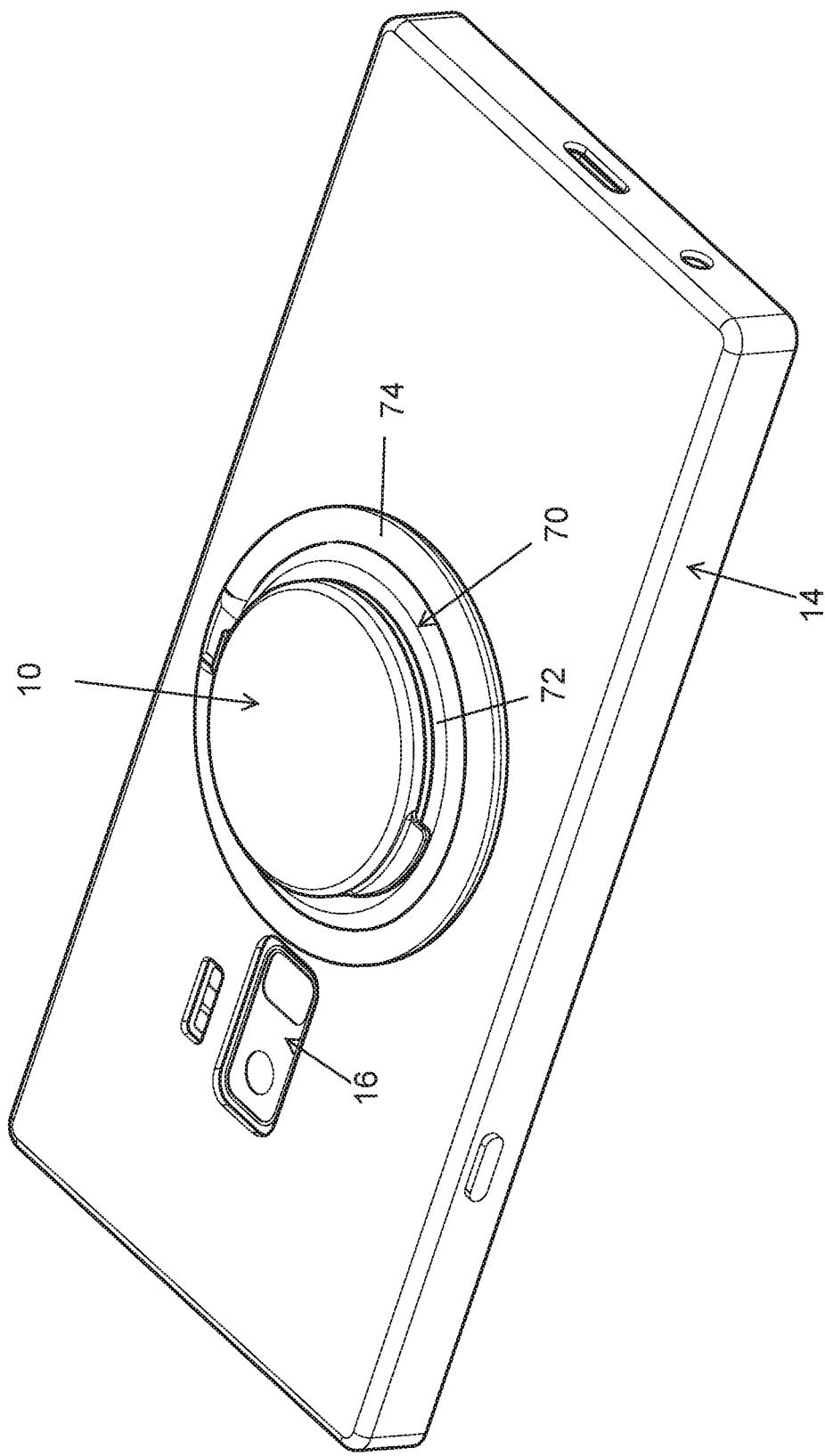
FIGS. 10A and 10B illustrate the storage accessory described herein attached to a different accessory that is affixed to a protective case of a mobile electronic device.
Figure 10B:
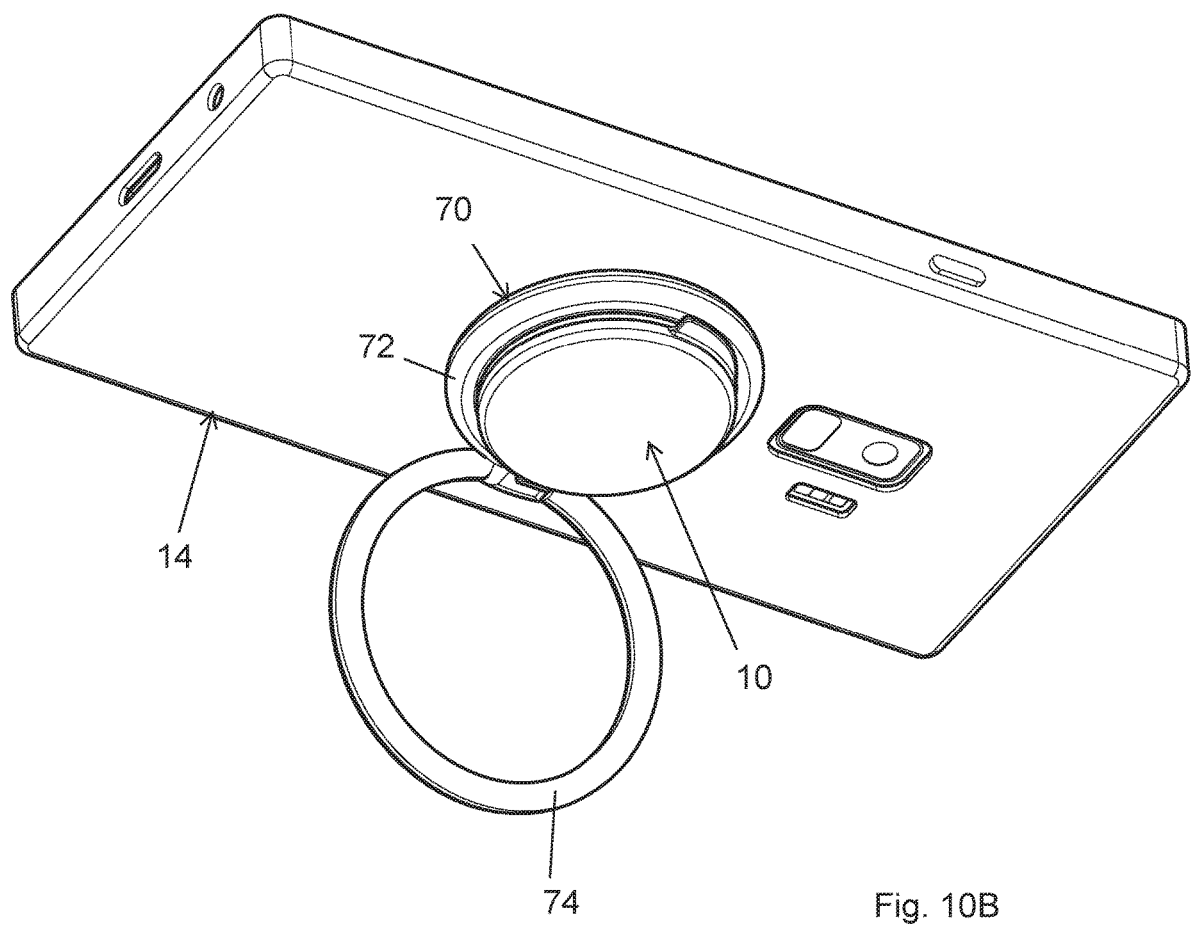
Figure 11A:
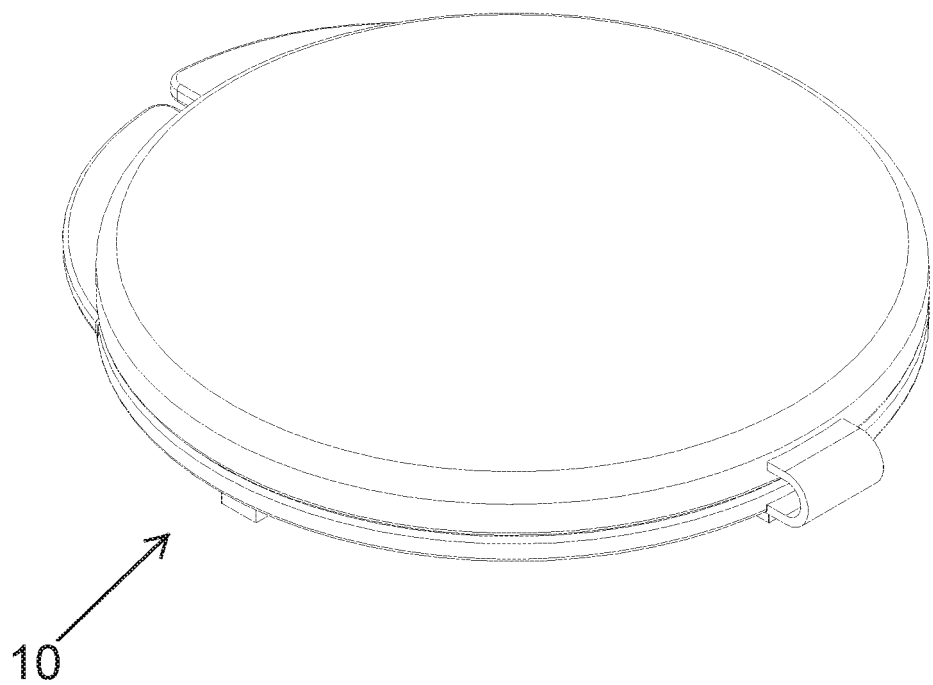
FIGS. 11A-11G are perspective, front, rear, top, bottom, left side and right side views, respectively, of an embodiment of the storage accessory.
Figure 11B:
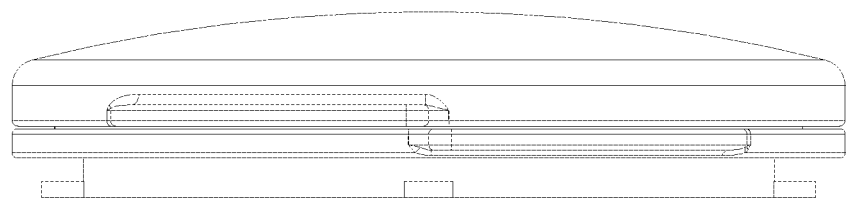
Figure 11C:
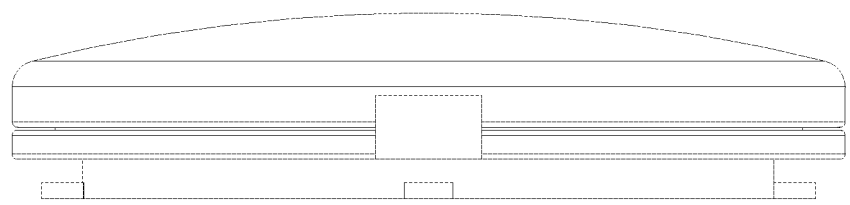
Figure 11D:
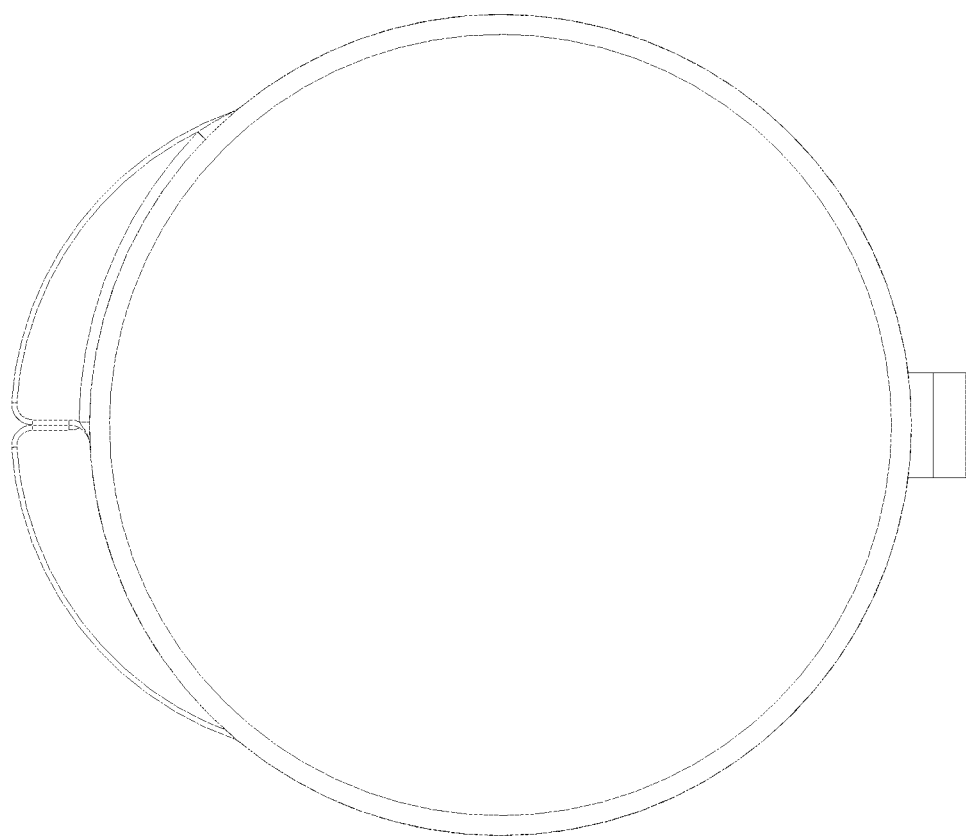
Figure 11E:
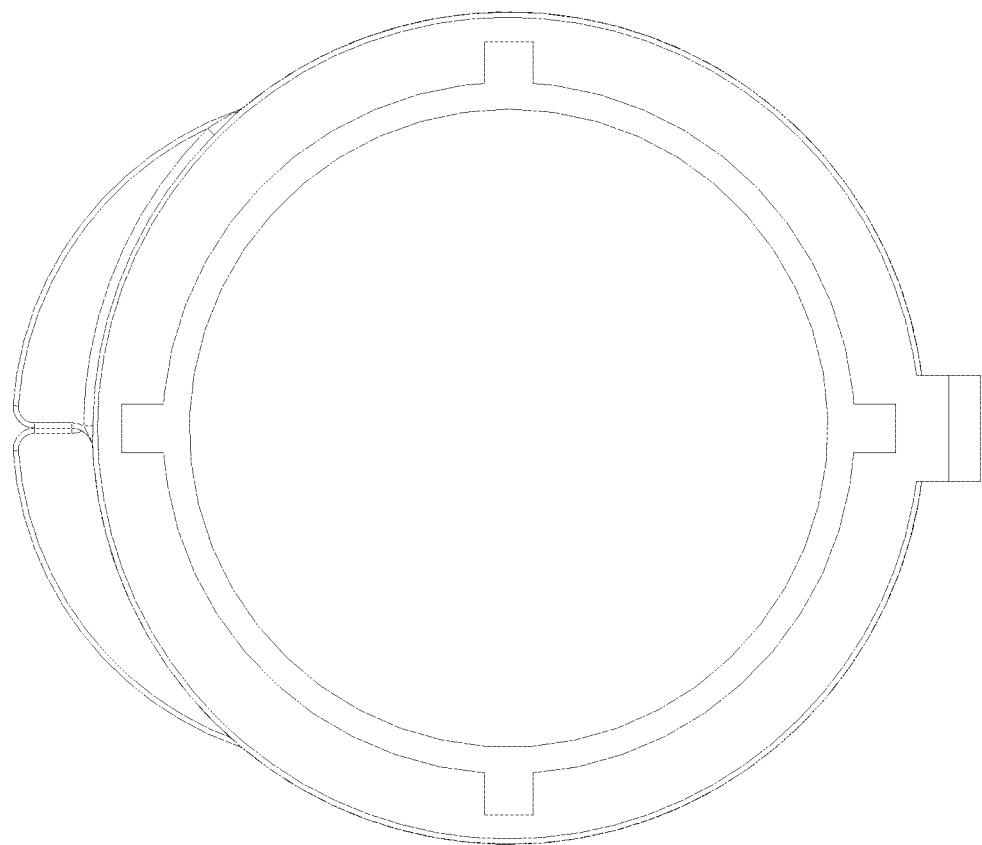
Figure 11F:
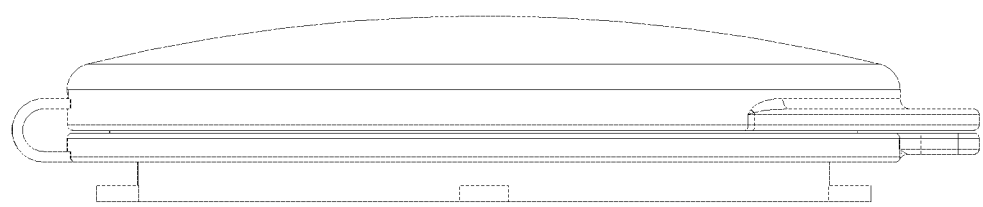
Figure 11G:
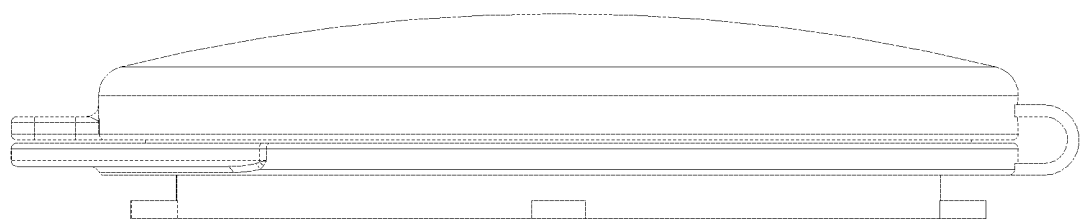

FIGS. 10A-10B illustrate the storage accessory 10 described herein attached to a mobile phone accessory 70 in the form of a ring holder/stand. The ring holder phone accessory 70 can be, for example, a FITFORT phone ring holder finger kickstand available from Dreamlink E-Commerce Co., Limited of Shenzhen, China. The accessory 70 includes a base 72 that in use is fixed to the protective case 14 of the mobile phone 16 (or alternatively directly to the rear of the mobile phone 16), and a ring 74 that is pivotally attached to the base 72 for pivoting movement between a collapsed position (FIG. 10A) and an open position (FIG. 10B). The storage accessory 10 is attached to the base 72 while permitting the ring 74 to pivot between the collapsed and open positions. In particular the base 24 is fixed to (for example centered on) the base 72 and the cover 26 is accessible to allow the cover 26 to be opened and closed as described above. The base 24 of the storage accessory 10 can be attached to the base 72 using any suitable fastening technique, such as an adhesive, a snap/button connection, hook and loop fastener, and the like.

Figure 12:
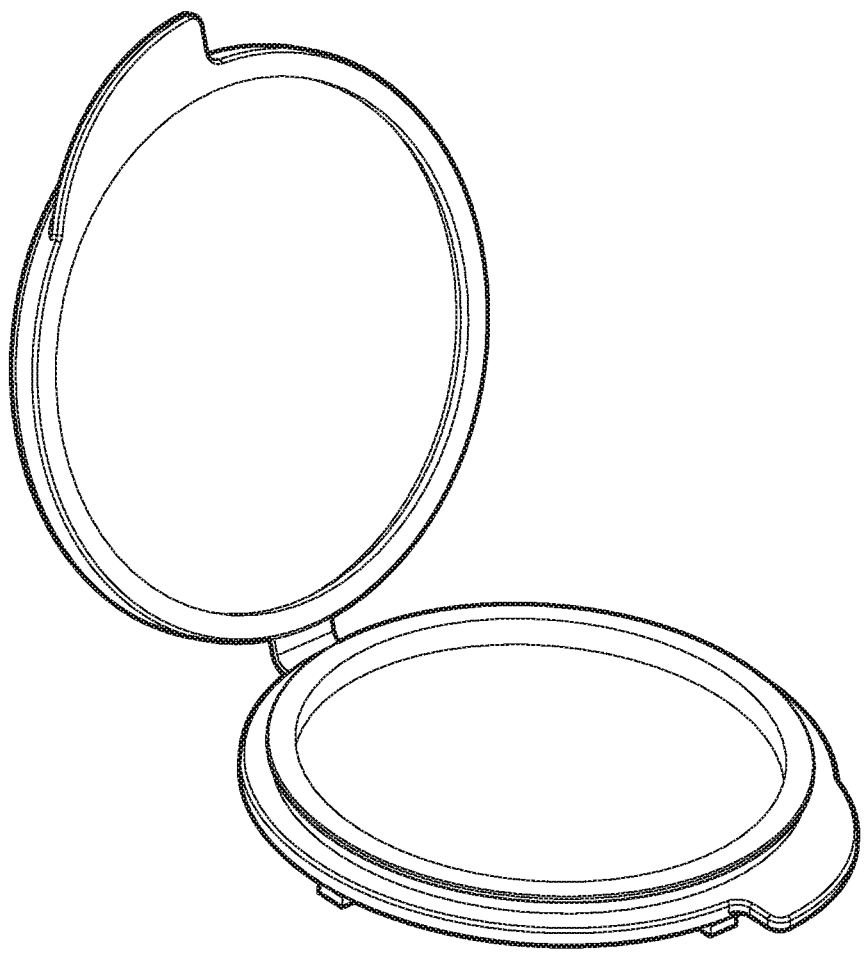
FIG. 12 depicts the storage accessory of FIGS. 11A-11G open.
Figure 13A:
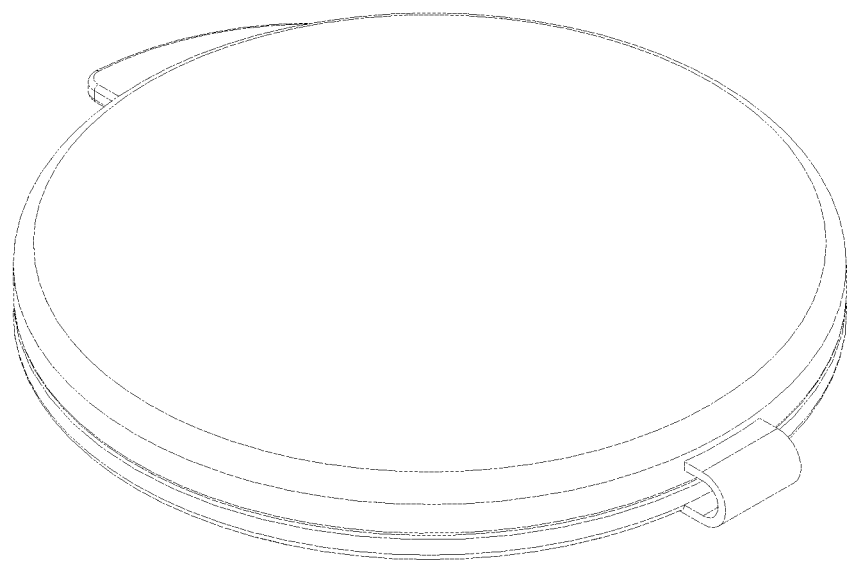
FIGS. 13A-13G are perspective, front, rear, top, bottom, left side and right side views, respectively, of another embodiment of the storage accessory.
Figure 13B:
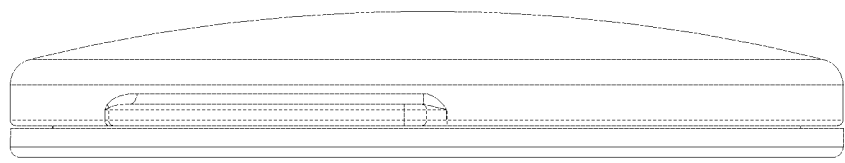
Figure 13C:
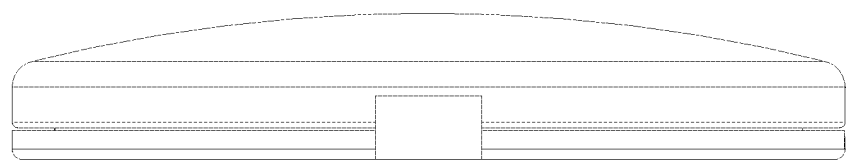
Figure 13D:
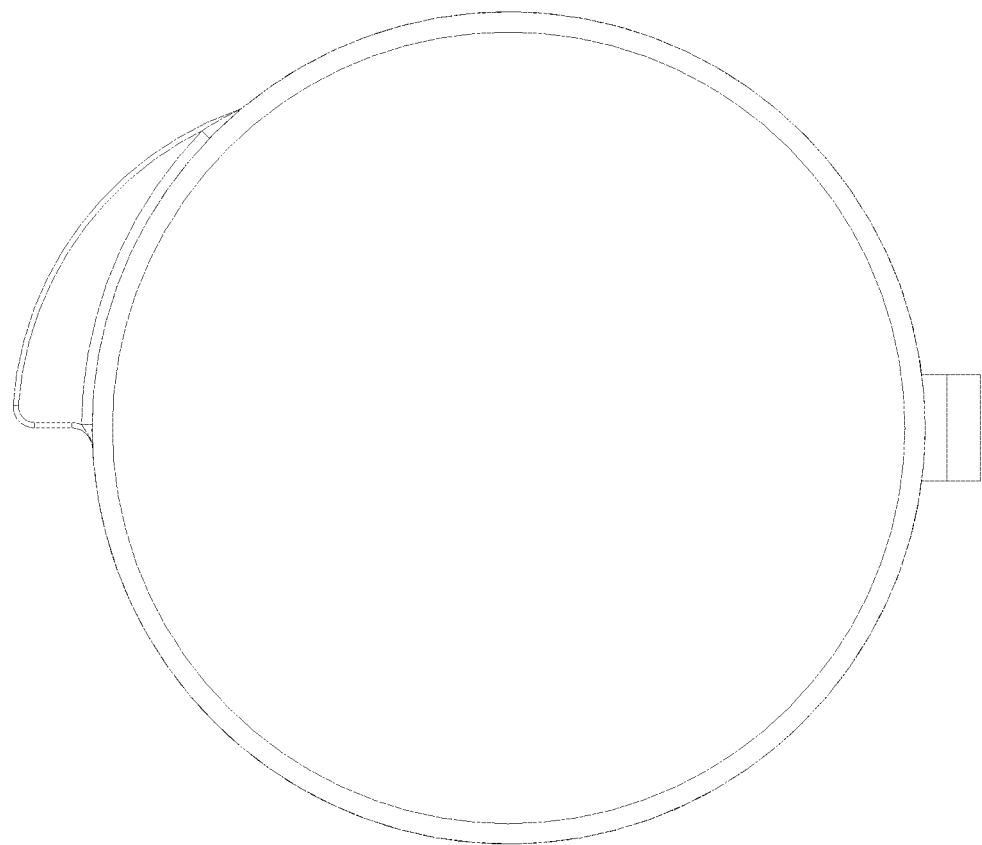
Figure 13E:
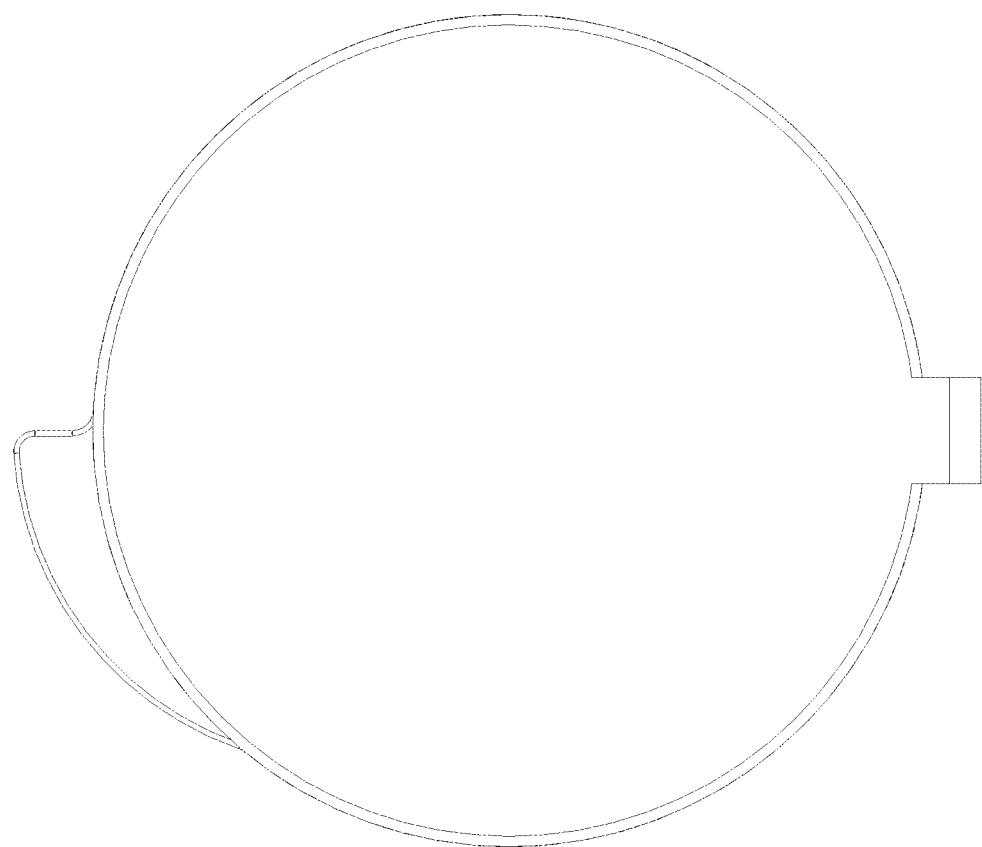
Figure 13F:
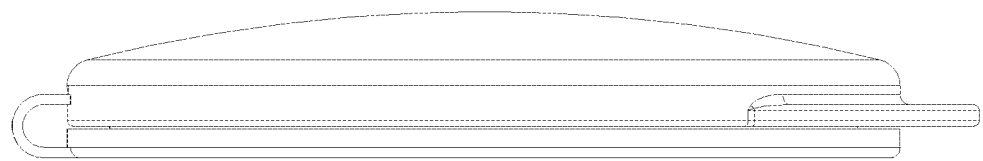
Figure 13G:
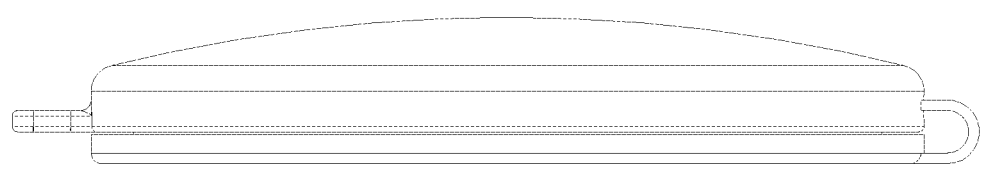

FIGS. 11A-11G are perspective, front, rear, top, bottom, left side and right side views of another embodiment of the storage accessory 10. FIG. 12 illustrates the storage accessory 10 of FIGS. 11A-11G in an open configuration.

Figure 14:
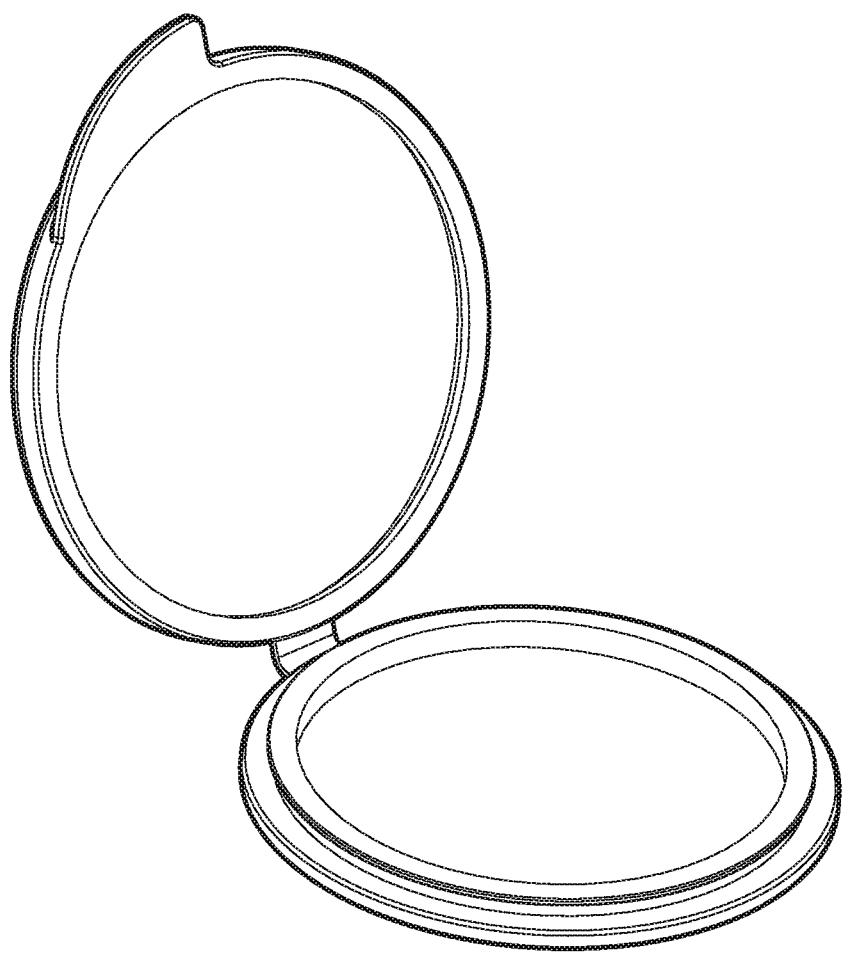
FIG. 14 depicts the storage accessory of FIGS. 13A-13G open.

FIGS. 13A-13G are perspective, front, rear, top, bottom, left side and right side views of another embodiment of the storage accessory 10. FIG. 14 illustrates the storage accessory 10 of FIGS. 13A-13G in an open configuration.

The storage accessory 10 can be attached to other mobile phone accessories as long as the accessory has a surface to which the base 24 of the storage accessory 10 can be attached, and the attachment can be achieved without interfering with or destroying the primary function of the mobile phone accessory.

In some embodiments, the storage accessory 10 can be attached to the mobile phone 16 or to the protective case 14, and a mobile phone accessory can be attached to the cover 26 of the storage accessory 10 so that the storage accessory 10 is physically located between the mobile phone accessory and the mobile phone 16 or the protective case 14. This would permit the mobile phone accessory to perform its intended function while still allowing a user to access an item located within the storage accessory 10.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

The invention claimed is:

1. A storage accessory for a mobile electronic device, comprising:
   a base having a bottom wall and a side wall;
   a cover,
   the cover is configured to be releasably engageable with the base so that the cover can be actuated between a covering position over the base and an uncovered position;
   wherein the cover and the base define a storage space when the cover is at the covering position; and
   means for attaching the base directly to the mobile electronic device or directly to a protective case of the mobile electronic device.

2. The storage accessory of claim 1, further comprising a living hinge between the base and the cover.

3. The storage accessory of claim 1, further comprising a liner in the base, or a liner in the cover, or a liner in the base and a liner in the cover.

4. The storage accessory of claim 3, wherein the liner is in the base, and the liner is non-destructively removable from the base.

5. The storage accessory of claim 1, wherein the means for attaching comprises an adhesive.

6. A method of providing a storage space on a mobile electronic device, comprising:
   securing the storage accessory of claim 1 directly to a housing of the mobile electronic device or directly to the protective case of the mobile electronic device.

* * * * *